United States Patent [19]

Zuffada et al.

[11] Patent Number: 4,941,204

[45] Date of Patent: Jul. 10, 1990

[54] GENERATING A STOP SIGNAL OF AN AUTOMATIC SEARCH PROCEDURE FOR A BROADCASTING STATION USING AN AVAILABLE AFC SIGNAL

[75] Inventors: Maurizio Zuffada, Milan; Fabrizio Sacchi, Gambarana, both of Italy

[73] Assignee: SGS-Thomson Microelectronics s.r.l., Italy

[21] Appl. No.: 302,280

[22] Filed: Jan. 27, 1989

[30] Foreign Application Priority Data

Jan. 28, 1988 [IT] Italy ................................ 83601 A/88

[51] Int. Cl.$^5$ ................................................ H04B 1/26
[52] U.S. Cl. .................................. 455/164; 455/182; 455/192
[58] Field of Search .............. 455/164, 182, 192, 260; 375/97

[56] References Cited

U.S. PATENT DOCUMENTS

| | | | |
|---|---|---|---|
| 3,824,475 | 7/1974 | Pflasterer | 455/164 |
| 4,123,716 | 10/1978 | Borg | 455/164 |
| 4,263,675 | 4/1981 | Hongu et al. | 455/192 |
| 4,302,778 | 11/1981 | Tanaka | 455/164 |
| 4,438,528 | 3/1984 | Hagaki | 455/164 |

Primary Examiner—Joseph A. Orsino
Assistant Examiner—Jill Jackson
Attorney, Agent, or Firm—Pollock, Vande Sande & Priddy

[57] ABSTRACT

During an automatic search scan of a broacasting station of a video receiver's tuner, the AFC signal generated by an existing automatic frequency control circuit of the receiver is applied to an input of four comparators. A first, switched threshold comparator commutes when the AFC signal is greater than the two switched threshold values $$VA' < AFC > VA'';$$

and enables a second comparator with a fixed threshold V1 comprised between the two switched threshold values of the first comparator. When the second comparator commutes causes the generation by an output buffer of a signal suitable for arresting the automatic search scan having thus detected on the AFC characteristic the presence of a carrier. When the automatic search scan is performed in an opposite direction, a similar detecting function is performed by means of a third, switched threshold, comparator commuting when the AFC signal is lower than the two switched threshold values:

$$VB' > AFC < VB'';$$

and enables a fourth comparator, with a fixed threshold V2 which is comprised between the two switched threshold values of the third comparator, and which my commuting causes the generation, by the same output buffer, of the arresting signal.

3 Claims, 1 Drawing Sheet

GENERATING A STOP SIGNAL OF AN AUTOMATIC SEARCH PROCEDURE FOR A BROADCASTING STATION USING AN AVAILABLE AFC SIGNAL

BACKGROUND OF THE INVENTION

1. Field of the invention

The present invention relates to video receivers in general and in particular to circuits for automatically searching broadcasting stations within a certain frequency band. The invention is particularly useful for video receivers though it may be also utilized in similar receivers.

2. Description of the prior art

An automatic search procedure for a broadcasting station consists in having the local oscillator or the frequency synthesizer of the tuner of a receiver perform a frequency excursion, from low frequencies to high frequencies or vice versa within a certain frequency band wherein broadcasting stations are to be found. The frequency excursion (continuous or more commonly carried out by a succession of equal increments of frequency) must be automatically arrested when a carrier is detected, in order for the operator to verify whether such a carrier belong or not to the desired broadcasting station and eventually to order the prosecution of the automatic search until another carrier is detected, and so on. In modern receivers this automatic search procedure is usually controlled by a microprocessor.

In video receivers it is a common practice to cause the arrest of the incremental frequency excursion of the local oscillator or synthesizer during an automatic search procedure for broadcasting stations by using synchronism and/or the so-called "fly-back" signal generated by the horizontal scanning yoke for obtaining a stop signal of the search scan; the detection, in the demodulated signal at the output of the intermediate frequency (IF) stages of the video receiver, of synchronism signals alerting that the tuner of the receiver is in tune with a video carrier.

On the other hand, in modern video receivers, at the output of the intermediate frequency stages, i.e. at the output of the intermediate frequency demodulator, there is usually a "SCART" socket for the connection of an eventual video recorder. The known system for arresting the search scan for broadcasting stations has the disadvantage that, for example during the play through the television set of a recorded video program, the tuning section and the intermediate frequency conversion and demodulation section thereof cannot be exploited independently for searching broadcasting stations and for receiving programs which could be simultaneously registered by means of a second video recorder connected thereto.

Notably, almost all tuners are provided with an automatic frequency control circuit (AFC) which ensures automatically a perfect and stable tuning once the tuner is brought within a certain tuning interval of frequencies, whose limits are: $f_o - \Delta f$ and $f_o + \Delta f$, where $f_o$ is the central carrier frequency and $\Delta f$ is a pre-established frequency interval. The AFC system substantially utilizes a circuit which compares the frequency of the signal applied to an input thereof with a standard video intermediate frequency (i.e. 38.9 MHz for television sets operating in accordance with the B/G standard); when the frequency of the input signal is equal to the IF, the voltage generated at an output terminal of the AFC circuit may be equal to a certain fractionary value $(V_s/x)$ of the supply voltage $V_s$, e.g. $V_s/2$ (commonly 6V); when the frequency of the input signal is lower than the IF, the output voltage generated by the circuit becomes lower than such a pre-established fractionary value of the supply voltage or higher when the frequency of the input signal is higher than the IF.

The voltage-frequency characteristic (AFC signal) of such a AFC circuit has the well-known "S" shape, centered on the frequency $f_o$ of a video carrier and is depicted in FIG. 1.

This characteristic, i.e. the AFC signal level curve in function of frequency, may be run through in either direction during a frequency scan by the local oscillator or synthesizer for the automatic search of broadcasting station, i.e. from low frequencies to high frequencies or vice versa.

OBJECTIVE AND SUMMARY OF THE INVENTION

It is a main objective of the present invention to provide a system for generating an arrest signal of an automatic search scan for a broadcasting station, when the presence of a video carrier is detected, which may be entirely implemented within the tuning and the demodulation section of the receiver.

This objective and other advantages are obtained by the method and the relative implementing circuit, objects of the present invention so as defined in the annexed claims.

The method of the present invention permits the generation of an arresting signal of an automatic search scan for a broadcasting station by using exclusively an AFC signal produced by an existing AFC circuit of the receiver. The method of the invention is such as to ensure the arrest of the search scan, e.g. of the incremental variation of the local oscillator or of the synthesizer frequency and the stop occurs only when the tuner has entered a tuning interval about a carrier $f_o$ comprised between certain limits: $f_o - \Delta f$ and $f_o + \Delta f$; so that, after stopping the search scan, the AFC system is capable of driving the tuner into perfect symphony with the so located video carrier.

Of course this last condition is absolutely necessary for permitting, upon the automatic stop of the search scan, to recognize the particular broadcasting station found.

According to the invention, the AFC signal produced by the AFC circuit of the receiver is applied to an input of four comparators. A first, switched threshold, comparator switches when the AFC signal reaches a level higher than the two set limit values of the switched threshold: i.e. $VA' < AFV > VA''$ and activates a second comparator, having a fixed threshold value V1 which is comprised between the two limit values $VA'$ and $VA''$ of the switched threshold of the first comparator. When this second comparator switches, determines the generation by means of an output buffer of an arresting signal of the automatic search scan, having thus detected on the AFC signal characteristic the actual presence of a carrier. When the automatic search scan is performed in an opposite direction, a similar detecting function for the presence of a carrier on the AFC signal characteristic is performed by means of a third, switched threshold, comparator switching when the AFC signal assumes a level lower and two set limit values of the switched threshold thereof: i.e. VB'>AFC <VB", and enabling a fourth comparator, having a fixed threshold value V2 which is comprised between the two limit values of the switched threshold of the third comparator, and which upon switching causes the generation of an arresting signal of the automatic search scan by the said output buffer.

By comparator it is intended a well-known circuit, essentially formed by a pair of suitably biased transistors, the bases of which constitute two input terminals of the comparator, to one of which a reference voltage (set threshold voltage) may be applied in order to keep one of the two transistors conducting, until a voltage signal, applied to the other of the two inputs, becomes sufficiently high (higher than the set threshold voltage) to determine the conduction of the other transistor of the pair thus causing the cut-off of the first transistor which is normally conducting. The comparator is said to be switching or commuting or changing of state when such a condition occurs whereby the signal applied to an input becomes higher than the reference (threshold) voltage applied to the other input.

In particular, by switched threshold comparator it is intended a comparator wherein when switching occurs also a pre-established modification of the threshold voltage occurs from a certain set value to another set value, whereby the comparator, after a change of state, remains in such a conditions until the signal applied to one of its inputs doesn't drop below the value of such a second (switched) threshold voltage.

Both types of circuits are well-known to a skilled technician and may be made in various forms and by utilizing different types of components.

BRIEF DESCRIPTION OF THE DRAWINGS

The invention will be more easily understood through the following detailed description of an embodiment thereof, with reference to the annexed drawing, wherein.

DESCRIPTION OF THE PREFERRED EMBODIMENT

Figure 2:
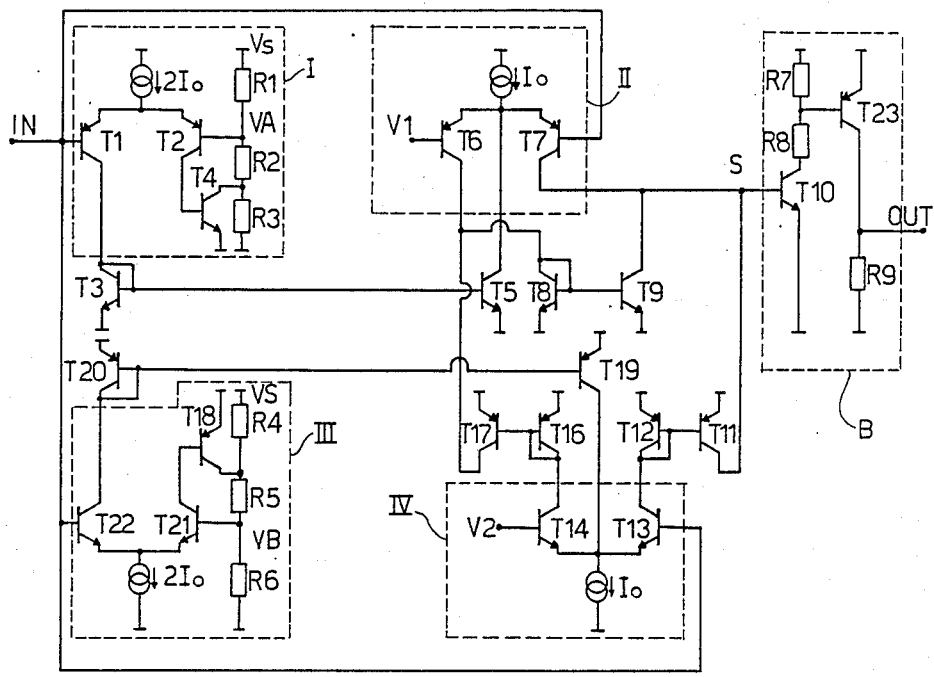
FIG. 2 is the circuit diagram of an embodiment of the circuit of the present invention.

With reference to FIG. 2, the four comparators (I, II, III and IV) utilized by the circuit of the invention, together with an output buffer B, are depicted inside respective dash line squares.

The two, switched threshold, comparators; namely I and III, have the values of their respective switched threshold voltages given by the following expressions:

$$VA' = V_s \frac{R_2 + R_3}{R_1 + R_2 + R_3} \text{ and } VA'' = V_s \frac{R_2 \text{(first comp.)}}{R_1 + R_2}$$

$$VB' = V_s \frac{R_6}{R_4 + R_5 + R_6} \text{ and } VB'' = V_s \frac{R_6 \text{(second comp.)}}{R_5 + R_6}$$

where $V_s$ is the supply voltage.

The two, fixed threshold, comparators; namely: II and IV, have threshold values V1 and V2, respectively, which are set by applying the appropriate constant voltages V1 and V2 to the relative input terminal of the two comparators, as shown in FIG. 2.

The values set for the two fixed thresholds: V1 and V2 will correspond upon the particular characteristic of the AFC signal generated by the relative AFC circuit of the receiver, to the two extremes: $f_o + \Delta f$ and $f_o - \Delta f$ of a frequency interval centered on the central frequency $f_o$ of a carrier, inside which the AFC system acts for tuning and keeping the receiver tuned with the central frequency $f_o$ of the video carrier. This is shown graphically in the diagram of FIG. 1. In the same diagram are also shown the respective values of the switched threshold of the other two comparators: I and III, in relation to said fixed threshold values V1 and V2 and in relation to said fractionary value voltage ($V_s/2$) of the supply voltage.

As it may be observed, the following relationships are implemented: VA'>V1 >VA">$V_s/2$ >VB">V2 >VB'.

The AFC signal generated by the relative circuit of the receiver, is applied to the input terminal IN of the circuit of FIG. 2, i.e. to the respective input terminal of all four comparators.

Figure 1:
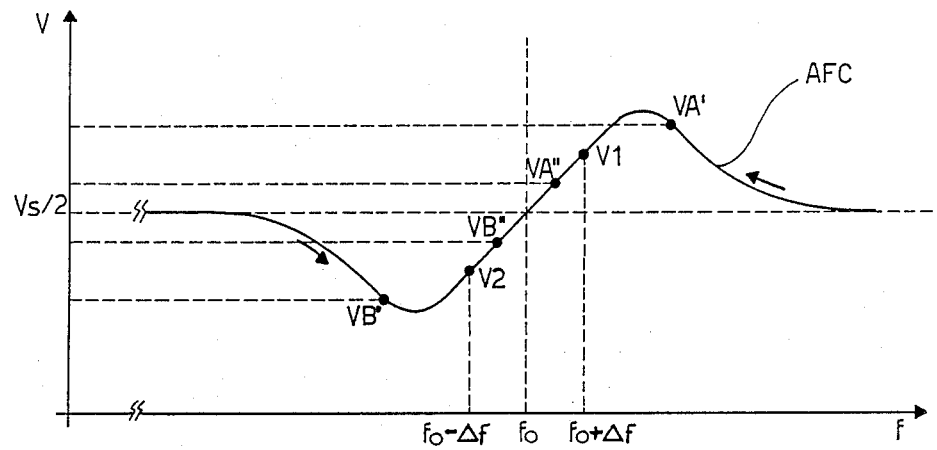
FIG. 1 shows the typical voltage-frequency characteristic of an AFC signal.

For explaining the operation of the circuit it is supposed that during the performance of an automatic search scan, the AFC signal's characteristic is run in a direction starting from a certain lower frequency toward a certain carrier frequency $f_o$, i.e. from left to right in the diagram of FIG. 1. In this case the voltage at the input IN of the circuit of FIG. 2 will be initially equal substantially to $V_s/2$ and will gradually drop toward the minimum of the "S" shaped AFC characteristic curve on approaching the frequency $f_o$. The transistor T1 of the first comparator I will be conducting and the transistor T2 will be cut-off. The bias current generator $2I_o$ will drive the current mirror formed by the transistors T3 and T5 and the latter will be maintained saturated and, consequently, the second comparator II, formed by the pair of transistors T6 and T7 and by the bias current generator $I_o$, will be disabled during this phase. Moreover, because the input voltage will be initially higher than either VB" or VB', the transistor T22 of the third comparator III will be conducting while the transistor T21 will be off and the transistor T18 will be also off so that the threshold voltage of this third comparator will be VB =VB'.

In this phase, the bias current generator $2I_o$ of the third comparator III will drive the current mirror formed by the transistors T20 and T19, keeping the latter saturated and consequently keeping off the fourth comparator IV, which is formed by the pair of transistors T14 and T13, until the input voltage (AFC signal) becomes equal or lower than the actual threshold voltage VB'.

Under these conditions the transistors T10 and T23, forming the two cascaded stages of the output buffer B are cut-off and therefore the signal at the output terminal OUT of the circuit is null.

When, upon a further increase of the frequency, the level of the AFC signal becomes lower than the VB' value (re: FIG. 1), the third comparator III switches and the transistor T21 starts conducting saturating the transistor T18 and the threshold level VB of the third comparator is modified to a level VB", higher than V2 (FIG. 1). Furthermore, by ceasing the driving of the current mirror formed by the two transistors T20 and T19, the fourth comparator IV is enabled, however being the input voltage still lower than the threshold level V2, the entire current $I_o$ of the bias generator of the fourth comparator IV is mirrored in the network formed by the transistors T14, T16, T17 and T8, causing the saturation of the transistor T9 and maintaining null the signal at the output terminal OUT of the circuit.

When the frequency f further approaches $f_o$, a condition will occur when the input voltage of the circuit becomes higher than the threshold level V2 of the fourth comparator IV. When this occurs, the transistor T13 from a cut-off condition passes to a conduction condition and therefore the total output current from the node S will become positive and the transistor T10 of the first stage of the output buffer B will become conducting thus saturating the transistor T23 and causing the signal at the output terminal OUT of the circuit to assume a value substantially equal to: $V_s - V_{CEsat}$.

The desired output signal is thus obtained which may be easily utilized for arresting of the automatic search scan.

If in performing an automatic search scan the AFC characteristic is run in an opposite direction, i.e. from a higher frequency toward a carrier frequency $f_o$ (from right to left in the diagram of FIG. 1), the analysis of the operation of the circuit of the invention of FIG. 2 is entirely similar to the one just described above.

For frequencies still sufficiently far higher than fo, the voltage applied to the input IN of the circuit of FIG. 2 (i.e. the AFC signal) will be initially equal to $V_s/2$, and higher than the threshold level VB. Therefore the transistor T22 will conduct while the transistor T21 will be off; the current through T22, being mirrored by T20 and T19, will keep disabled the fourth comparator. Moreover the input voltage will still be lower than both levels VA' and VA" of the switched threshold: of the first comparator and therefore the transistor T1 will conduct while the transistor T2 will be off. As a consequence, the transistor T4 will be off and the threshold level of the first comparator will be VA =VA'. The current flowing through transistor T1 will also be mirrored by the current mirror formed by transistors T3 and T5 and will maintain disabled the second comparator, formed BY the transistors T6 and T7. During this phase, the transistors of the output buffer B, T10 and T23, will obviously remain cut-off and the signal at the output terminal OUT of the circuit will be null.

These conditions change when, on approaching the frequency $f_o$, the voltage at the input IN of the circuit (i.e. the AFC signal's level) rises until it becomes equal to or greater than the actual threshold level VA' (FIG. 1). When this occurs, the transistor T2 will conduct and saturate the transistor T4, so that the threshold level of the first comparator will change to VA" (i.e. lower than V1). Being the transistor T3 off, the second comparator, formed by the transistors T6 and T7 and by the relative bias generator $I_o$, will become enabled, however because the voltage at the input IN of the circuit still remains for the time being higher than the threshold voltage V1 of the second comparator (FIG. 1), the current of the bias generator $I_o$ will be mirrored by the transistors T6, T8 and T9 will remain saturated so that the voltage at the output terminal OUT of the circuit will be null.

Finally, when the voltage applied to the input terminal IN of the circuit becomes lower than the threshold level V1 of the second comparator, the transistor T7 will conduct while the transistors T6, T8 and T9 will be cut-off, thus causing the transistor T10 to conduct and to drive to saturation the transistor T23, thus generating at the output terminal OUT of the circuit a signal having a level equal to about: $V_s - V_{CEsat}$.

In this case also the desired output signal will be generated to be utilized for arresting the automatic search scan.

In both cases, the arrest of the automatic search scan, or of the incremental variation of the frequency of the local oscillator or synthesizer of the tuner of the receiver occurs when the tuner is tuned on a frequency which is comprised within the limits $f_o - \Delta f$ and $f_o + \Delta f$ of the frequency interval centered on a carrier frequency fo. Following the arrest of any further incremental variation of the frequency by the automatic search system, the AFC system of the tuner takes control. The AFC system, typically through increments of frequency of much reduced magnitude in respect to the necessarily much larger increments of frequency used by the automatic search scan system, automatically brings the receiver in perfect tuning with the central frequency fo of the found carrier.

What is claimed is:

1. A circuit for detecting in an AFC signal, generated by an automatic frequency control circuit of a receiver during a search scan for a broadcasting station, the presence of a carrier comprising:
   a first switched threshold comparator with two threshold levels VA', VA", commuting when said AFC signal which is applied to an input terminal of the first comparator rises to a level higher than the two threshold levels of said first switched threshold comparator wherein commuting of the first comparator is in accordance with the following relation:

VA'<AFC>VA";

a second comparator having a fixed threshold level v1 and which is enabled when said first comparator commutes in accordance with said relation, commuting when said AFC signal which is applied to an input terminal of said second comparator drops to a level lower than said threshold V1;
   a third switched threshold comparator with two threshold levels VB', VB", which commutes when said AFC signal which is applied to an input terminal thereof drops to a level lower than the two threshold levels of said third switched threshold comparator wherein the third comparator commutes in accordance with the following second relation:

VB'>AFC<VBz";

a fourth comparator having a fixed threshold level V2 and which is enabled when said third comparator commutes in accordance with said second relation, commuting when said AFC signal which is applied to an input terminal thereof rises to a level higher than said threshold V2;
   an output buffer, driven by said second or by said fourth comparator, and capable of generating an output signal when any of said second and fourth comparators commutes, thus detecting the presence of the carrier;
   and wherein:
   the relationships among said threshold levels of said comparators are as follows:

VA'>V1>Va">V/x>VB">V2>VB, where V/x is a fraction of the supply voltage powering the circuit and corresponds to the AFC signal level when the receiver is out of tune.

2. A method for arresting an automatic search scan of a broadcasting station when the presence of a video carrier is detected based upon the utilization of an AFC signal generated by an existing automatic frequency control circuit of a receiver, steps of the method comprising:

applying said AFC signal to input terminals of a first switched threshold comparator, a second comparator, a third switched threshold comparator and a fourth comparator;

comparing the AFC signal to two threshold values $VA_{,}, VA''$ of the first comparator and commuting when the AFC signal rises above the threshold values $VA_{,}, VA''$ in accordance with the following relation:

$$VA' < AFC >'';$$

actuating the second comparator in response to the commuting of the first comparator for comparing the AFC signal to a fixed threshold value v1 and for commuting when the AFC signal is lower;

comparing the AFC signal to two threshold values $VB_{,}, VB''$ of the third comparator and commuting when the AFC signal is lower than the threshold values $VB_{,}, VB''$ in accordance with the following relation:

$$VB'' > AFC < VB'';$$

actuating the fourth comparator in response to the commuting of the third comparator for comparing the AFC signal to fixed threshold value V2 and for commuting when the AFC signal is higher;

the threshold values of the four comparators having the following relationship:

$$VA' > V1 > VA'' > V_s/x > VB'' > V2 > VB'$$

where $V_s/x$ is a fraction of the supply voltage powering the circuit and corresponds to the AFC signal level when the receiver is out of tune;

generating an output signal from an output buffer in response to committing of either the second or the fourth comparators; and arresting the automatic search scanning response to said output signal, having thus detected the presence of the carrier by means of said AFC signal generated by said existing automatic frequency control circuit of the receiver.

3. The method according to claim 2, wherein said threshold values V1 and V2 of said second and fourth comparators, respectively, coincide, on a voltage-frequency characteristic of said AFC signal, to the two limits: $f_o + \Delta f$ and $f_o - \Delta f$, of a frequency interval, where $f_o$ is the central frequency of said a video carrier and $\Delta f$ is an interval of frequencies whose magnitude is established by the respective set values of said thresholds V1 and V2;

said automatic frequency control circuit being capable of tuning the receiver on said central frequency $f_o$ of the video carrier when the tuner frequency enters said frequency interval during a search scan.

* * * * *